United States Patent [19]

Northrup et al.

[11] Patent Number: 4,698,834
[45] Date of Patent: Oct. 6, 1987

[54] X-RAY MASK MEMBRANE DEFLECTION COMPENSATOR AND METHOD

[75] Inventors: Ronnie Northrup; Bernard Fay, both of San Jose, Calif.

[73] Assignee: Micronix Corporation, Los Gatos, Calif.

[21] Appl. No.: 828,837

[22] Filed: Feb. 12, 1986

[51] Int. Cl.⁴ .............................................. G21K 5/08
[52] U.S. Cl. .................................. 378/34; 250/492.2; 250/491.1
[58] Field of Search ................. 378/34, 35; 250/492.2, 250/492.21, 492.3, 492.22, 491.1; 356/352, 356, 358, 363

[56] References Cited

U.S. PATENT DOCUMENTS 4,443,107  4/1984  Alexander et al. .................. 356/358
4,457,223  10/1984  Taniguchi et al. ..................... 378/34

Primary Examiner—Janice A. Howell
Assistant Examiner—David P. Porta
Attorney, Agent, or Firm—Thomas S. MacDonald; Alan H. MacPherson; Paul J. Winters

[57] ABSTRACT

An x-ray mask membrane reflection compensator includes an x-ray chamber having a transmitting gaseous media therein chamber through which x-rays are directed to a mask membrane that is positioned in close spaced proximity to a resist-coated wafer. A controlled environment of processing gas is provided within a gap between the mask membrane and wafer surfaces. The processing gas and gaseous media pressures variously cause bulging of the membrane resulting in a descrepancy in the gap distance across the field of view. A laser source provides an incident beam of light which is directed at an incident angle to the mask membrane and the wafer surface such that return beams are reflected and interference fringe patterns, due to slight nonparallelism of the mask membrane and the wafer are displayed on a monitor. A standard reference line is established by a reference fringe band at a null position of the mask membrane and the movement of the reference fringe based from the references line is utilized to detect the deflection of the mask membrane by reason of a net differential pressure on the mask membrane. Control of the pressure of the processing gas or chamber gaseous media returns the reference fringe band pressure to the reference line to indicate that the mask membrane is back at a null, nondeflected position.

19 Claims, 9 Drawing Figures

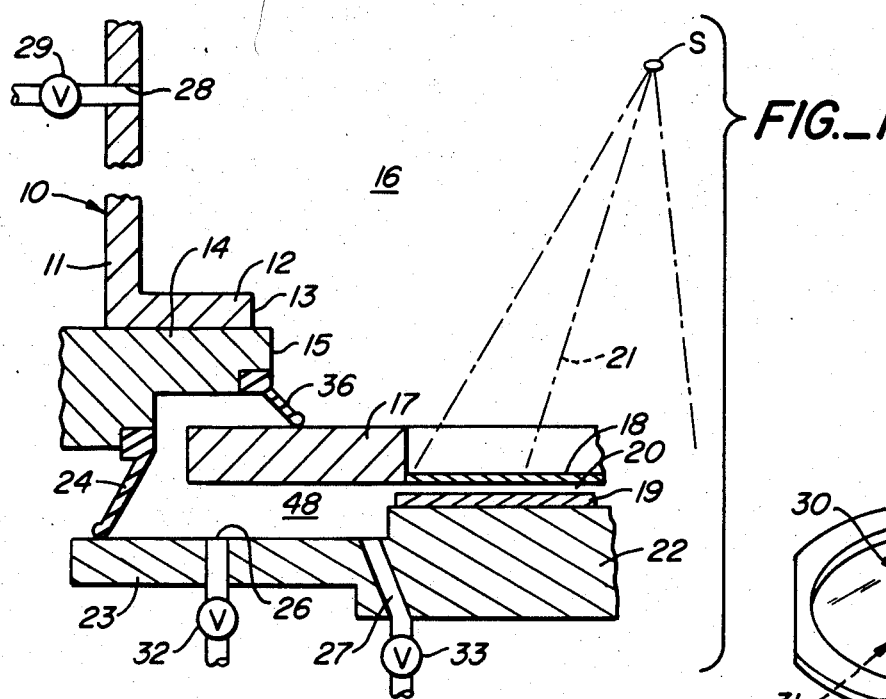
FIG._1.
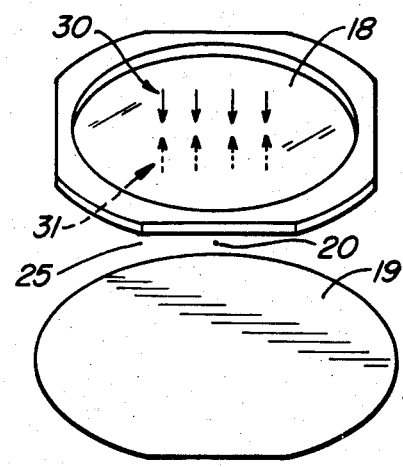
FIG._2.
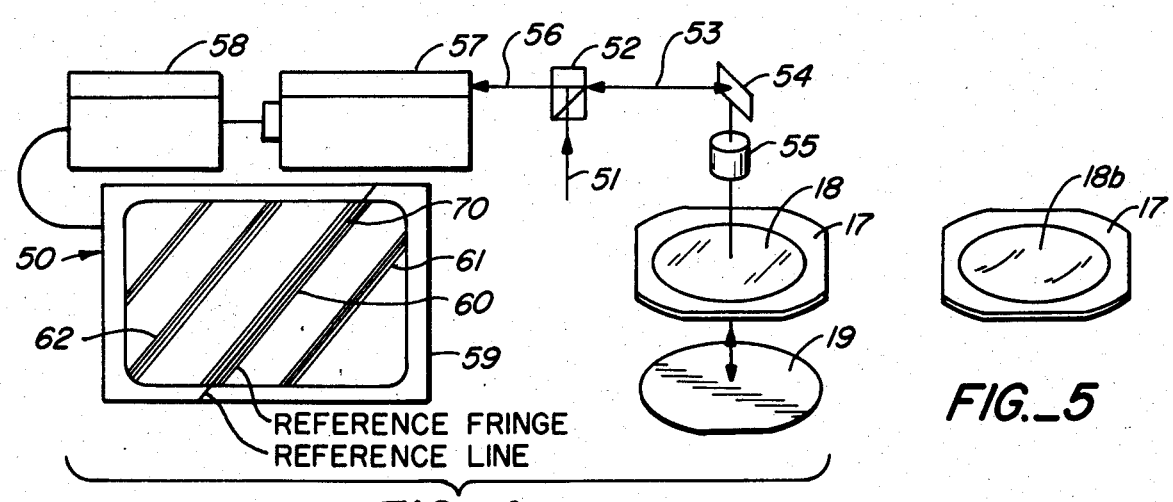
FIG._3.
FIG._4.
FIG._5

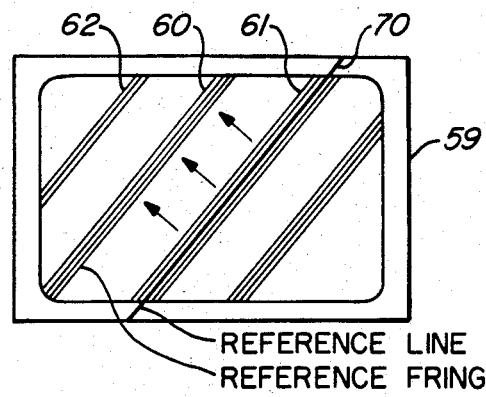
FIG._6.
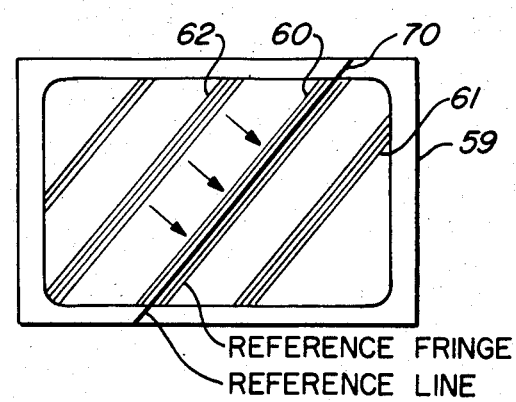
FIG._7.
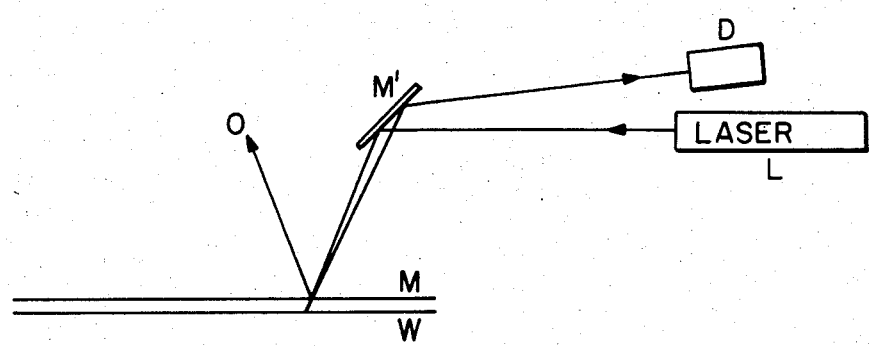
FIG._8.
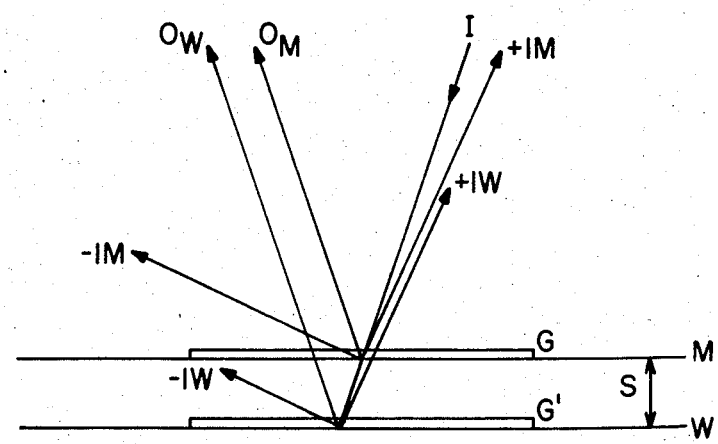
FIG._9.

X-RAY MASK MEMBRANE DEFLECTION COMPENSATOR AND METHOD

CROSS-REFERENCE TO RELATED APPLICATION

This application is an improvement of U.S. Application Ser. No. 06/673,964, filed Nov. 21, 1984 now U.S. Pat. No. 4,648,106, inventor Thomas W. Novak and assigned to the same assignee as this application. The subject matter and disclosure of Ser. No. 06/673,964 is herein incorporated by reference.

BACKGROUND OF THE INVENTION

1. Field of the Invention

This invention relates to a lithographic mask-to-wafer alignment system, particularly one employing x-ray or other beam-like imaging systems for printing replicas of patterns contained on masks onto photosensitive materials contained on semiconductor substrates such as silicon wafers. Particularly, the invention relates to the control of x-ray attenuation gases and wafer processing gases and the spacing between the mask membrane and wafer.

2. Description of the Relevant Art

U.S. Pat. No. 4,185,202 discloses an x-ray lithography system involving an x-ray source, an x-ray transmission chamber and an imaging or exposing chamber into which a prealigned mask-wafer fixture is moved into position under the source at the bottom of the exposing chamber for each exposure. The transmission chamber is maintained in a vacuum at a pressure less than about $10^{-6}$ torr while an x-ray attnuation gas such as helium is present in the imaging or exposure chamber which limits the throughput capabilities of the system. The improvement in the '202 patent is directed to having a movable (expandible) exposure chamber with a side wall which is lowered to engage the mask-wafer fixture. Helium is flowed into the chamber for each exposure at a rate of 10 liters/minute through a passageway. A separate atmosphere of inert gas, e.g., nitrogen at a rate of 2.9 liter/minute at a pressure of 5-50 psi is provided within the fixture and the zone between the mask underside and the wafer. Flushing of the zone is initially started while the fixture is still being loaded remote from the exposure chamber. The '202 patent also mentions that it may be advantageous to maintain the pressure in the exposure chamber greater than in the mask-to-wafer zone to prevent gaseous constituents in the latter being introduced to the former and contemplates addition of a small amount of inhibiting oxygen in the mask-to-wafer zone.

In the related application, a purge of x-ray attenuation gas on top of the mask membrane and wafer processing gas under the mask membrane is provided so as to provide an essentially zero pressure differential across the mask membrane to obviate any change in the gap distance between the mask membrane and wafer. It also recognizes that the membrane may bulge in the center which would introduce mask-to-wafer gap changes and resulting printing distortion and that the allowable pressure difference across the membrane is so small as to be not economically measurable by available sensors.

SUMMARY

The present invention is directed to a mask membrane deflection compensator and method of monitoring and adjusting x-ray mask membrane deflection so as to have a constant even gap between the mask membrane and an associated spaced wafer surface during printing exposures, particularly where there are different gases in contact with opposed surfaces of the mask membrane. Typically, an x-ray inert gaseous media is exposed to the surface of the mask membrane facing the x-ray source and a wafer processing gas exposed to the opposed surface in the gap between the mask membrane and the wafer. The latter gases are used, for example, for exposing photoresists applied to the wafer surface. Even when these gases are applied in an open system, as distinguished from being under pressure in a closed volume, they still exert a significant force on the thin mask membrane which can physically distort or be deflected. The pressure of an inert gas between an x-ray source and the mask acting on one side of the mask membrane and the pressure of wafer processing gas between the mask and wafer acting on an opposed side of the mask membrane are controlled by monitoring the deflection of the mask membrane and controlling the respective gas pressures.

A compensator is provided to detect and indicate membrane deflection caused by any differential pressure across the membrane. Based on the observed deflection, the gas flows of one or both of the gases is adjusted so that the two gases exert equal and opposite forces on the membrane, thus reducing or nulling membrane distortion due to any net differential pressure across the mask membrane.

In one embodiment, as seen in U.S. Pat. No. 4,516,253, a He-Ne laser may be utilized to provide incident illumination on a mask and wafer which is, in conjunction with zone plates and targets, used to align the mask and wafer and to adjust the gap therebetween. The present invention may use this same laser source and by appropriate beam splitting have the laser beams reflect back from the mask membrane surface and from the wafer surface to cause at least two return beams to interact with each other. A separate laser source may also be employed. The beams add constructively or destructively, i.e., similar to the effect seen in a laser interferometer, depending on the beam path length difference. This path length difference is dependent on the gap between the mask and wafer and the angle of the illumination and the return beams.

In this embodiment the return beams are detected by a camera or monitor after passing through an optical imaging system. A series of interference fringes are then seen on developed film or on a monitor, which fringes appear as alternating light and dark bands in the clear areas of the mask. These bands are caused by a small amount of nonparallelism between the mask and wafer across the field of view. After a stationary reference line is assigned to one band of the fringes (and, for example, indicated visually on the monitor) when the membrane is at static (nondeflected/null) state, introduction of an attenuation gas above the membrane causes a downward bulging or deflection of the membrane and for example, a right to left travel of the fringe pattern. The gas flow of the attenuation gas is adjusted so that the next adjacent band next to the reference band is shifted to be centered on the stationary reference line. At this point, the area of the mask membrane being imaged is deflected downward in the systems described herein (or outwardly with respect to the x-ray attenuation gas in the x-ray transmission chamber). Subsequently, a particular wafer processing gas is introduced in the space between the mask and wafer deflecting the mask upwardly and exhibiting a left to right travel of the fringe pattern on the monitor. The processing gas flow is adjusted so that the initial reference fringe band is centered with the stationary reference line thus indicating that a null membrane position with a zero pressure differential across the mask has been reached.

The above gas flows can be adjusted by repeating the above operations in shifting the interference bands and returning them to the reference position until a desired gas flow rate is reached optimizing operation of the photolithography system and maintaining zero mask membrane deflection for printing operations.

In a second embodiment, a narrow laser beam is used as the illumination source directly without employing an objective lens axis as in the first embodiment. Light which is either reflected or diffracted from the mask is detected using a standard optical detector. The area illuminated is partially transparent to the illumination, allowing the detector to monitor a combination of light diffracted both from the mask and from the wafer, and the intensity variation that results from any mask to wafer gap change.

BRIEF DESCRIPTION OF THE DRAWING

FIG. 1 is a partial schematic cross-sectional view of an x-ray source attenuation chamber and mounted mask membrane in association with a wafer-holding chuck.

FIG. 2 is a perspective exploded view of a mask membrane and associated wafer showing opposed gas pressure forces on the membrane.

FIG. 3 is a schematic view of the incident light and return beams resultant from reflection from mask membrane and wafer surfaces.

FIG. 4 is a schematic view of the overall x-ray mask deflection compensating apparatus with interference fringes displayed on a monitor.

FIG. 5 is a perspective view of the mask membrane with the membrane deflected due to pressure of an x-ray attenuation gas.

FIG. 6 is a schematic view of a monitor display showing shift of a reference fringe during the outward bulging of the mask membrane shown in FIG. 5.

FIG. 7 is a schematic view of the monitor display showing the return of the reference fringe to a referenced line indicative of a null position of the mask membrane.

FIG. 8 is a schematic view of the ray pattern in a second embodiment of the invention.

FIG. 9 is a schematic view of the ray pattern in a further embodiment of the invention.

DETAILED DESCRIPTION

The present invention has particularly utility in an x-ray lithography system in which an x-ray source is positioned to emit a bundle of x-rays through an x-ray attenuation chamber 10 to a mask membrane at an exit end of the chamber. Partially shown in FIG. 1, the chamber normally is a cylindrical shell. X-ray sources are typically, those described in U.S. Pat. No. 4,516,253, positioned above the chamber X-rays pass through a beryllium window (not shown) and then through the interior of the chamber 10 so as to strike on and through clear portions on a thin planar membrane 18 of a planar mask 17. The mask is spacedly positioned above a semiconductor wafer 19. Chamber 10 comprises a vertical cylindrical side wall 11 and a bottom flange wall 12 having an opening 13 through which the x-rays pass and within which a gaseous media 16 contained in the chamber 10 volume is present. Chamber 10 is fixedly and sealingly mounted on a base 14 of the overall lithographic system. The mask 17 is held by an appropriate mask holder as shown, for example, in U.S. Pat. No. 4,576,253 and is sealed by circular flex seal 36 that extends between an inner peripheral edge 15 of base 14 and a top surface of mask 17. Suitable mask constructions are described in U.S. Pat. No. 4,185,202. The semiconductor wafer 19 is mounted on a vacuum pin chuck 22 or the like so that the wafer extends in general parallelism with the mask membrane and having a gap 20 therebetween. A second circular flexible seal 24 extends from base 14 to an upper surface of a flange 23 extending from chuck 22. The seals confine a processing gas 48 between the wafer 19 and the mask membrane 18.

A processing gas inlet 26 is provided through flange 23. A conduit and valve 32 for controlling the flow and hence pressure of the processing gas between the mask and wafer is provided. A gas outlet 27 is also provided in the flange 23 with a suitable valve 33 for removal of processing gas by vacuum or other pumping means. The x-ray attenuation gaseous media 16 may be helium or other inert gas used to attenuate x-rays from the x-ray source to the mask. The special gases or herein termed "processing gases" which are present in the mask-wafer interface are used for exposing various layers of photoresist, for example, applied to the surface of the semiconductor wafer. These resists are used in constructing the various devices, for example, of an integrated circuit.

It has been found that gases 16 and 48 even when applied in an open system will still exert a significant force on the mask membrane hich can physically distort or deflect the membrane causing resultant changes in the gap 20 across the field of view 59. The present invention is directed to a means for indicating membrane deflection and where necessary means for adjusting the gas flow of both the x-ray chamber gaseous media and the processing gas in such a manner so that these gases will exert equal and opposite forces on the membrane thus reducing membrane distortion due to any net differential pressure across the mask membrane 18.

FIG. 2 schematically shows the possible deflection of the mask membrane 18. Arrows 30 indicate the condition where there is a net positive pressure above the membrane, i.e., of gas 16 which tends to bulge membrane 18 downwardly toward the wafer 19. Dotted arrows 31 indicate a higher pressure or flow in the gap 20 from the processing gas 48 which exerts a pressure or force to cause membrane 18 to bulge inwardly or back to its original null position by reason of the pressure on the outside surface of the membrane 18.

In FIG. 3, an incident beam of light 40, for example, from a coherent optical laser illumination source strikes a surface 18a of membrane 18 at an angle $\theta$ and passes through a clear area of the membrane mask 18 to a top surface 19a of the semiconductor wafer 19. At least two return beams A and reflect back from the top surfaces 18a and 19a. These beams will interact with each other and may add constructively or destructively, depending on the path length differences. This path length difference is dependent on the gap 20 between the mask and wafer and the angle $\theta$ of the incident beam.

When the path length difference is a multiple of $\lambda$, both the mask and wafer reflective wavefronts are in place thus causing maximum constructive interference and the resulting "light" band fringe in FIGS. 4, 6 and 7. When the path length difference is λ/2 a positive integer multiple of λ, both the mask and the wafer wavefronts are 180° out of phase thus causing maximum destructive interference and the resulting "dark" band fringe in FIGS. 4, 6 and 7.

As seen in FIG. 4, an objective lens 55 directs the incident illumination onto the mask membrane near perpendicular, i.e., where θ is approximately 87°. Other incident angles can be used provided there is a return image showing the fringe pattern produced by the interaction of the reflected wavefront beam from both mask and wafer. Return beams A and B are detected by a camera after passing through an optical imaging system 57. The laser illumination is provided by a laser source 51, typically a He-Ne laser having a wave length of approximately 633 nm, through a polarized beamsplitter 52 which directs the laser beam to a mirror 54 and then through objective 55 to the surfaces 18a and 19a of the mask membrane and wafer. The return beams are directed through the objective, mirror and beamsplitter through path 56 to an optical imaging system 57. Resultant interference fringe patterns are seen on a monitor 59 or on film or video from a camera 58. The interference fringes appears as alternating light and dark bands in the clear areas of the mask. These bands are caused by a small amount of nonparallelism (approximately 1.2 μm) between the mask and wafer across the field of view.

Interference fringes 60, 61 and 62 are shown visually displayed on monitor 59. Arbitrarily, a fringe 60 is chosen as a reference fringe. At the center of the chosen reference fringe, a visual reference line 70 is constructed by memory. Reference line 70 is indicative of a position where there are no gases (other than ambient air) applied in on the respective top and bottom surfaces of membrane 18. This is so-called "null" position where the membrane is at static state and the membrane deflection is zero. As the gaseous media is introduced into chamber 10, for example, through valve 29 and conduit 28 the membrane will deflect downwardly or outwardly and cause a right to left travel of the fringe patterns. The gas flow through valve 29 is adjusted such that fringe 61 to the immediate right of the reference fringe 60 will then be centered with the stationary reference line 70. Such a movement of the fringe 61 from its position shown in FIG. 4 to its position shown in FIG. 6 is small enough so as to not destroy or injure the very thin mass membrane, which has a thickness of the order of four to eight microns. At this time, the area of the mask being imaged is deflected downwardly by approximately $\mu/2$ as shown in FIG. 6 where $\mu$ is equal to the wavelength of the optical laser illumination or in this example 633 nm. The amount of the bulge at the area being observed is equal to $\mu/2$. The pressure in the chamber is approximately $1 \times 10^{-3}$ inches of water.

In the next sequence the processing gas required for photoresist exposure or other process step in the manufacture of the integrated circuits or other constructions on the semiconductor wafer are introduced through valve 32 between the mask and wafer particularly in the gap 20. The membrane 18 will now deflect upwardly (or inwardly back towards chamber 10) and the fringe patterns being displayed will exhibit a left-to-right travel of the fringe patterns as shown by the arrows in FIG. 7. The reference fringe 60 then is positioned back on reference line 70 and is indicative that the pressures of the attenuating gas and the process gas are such as to have a net zero differential pressure across the mask membrane 18. The mask membrane is now back at its null position.

The above steps of shifting the fringe pattern one increment to the left due to increase pressure of the chamber gaseous media, followed by shifting the displaced fringe back to its original position on the reference line by providing more processing gas flow into the mask-to-wafer interface is repeated until there is an overall gas flow of each of the gaseous media and processing gas, as needed for the process steps and for preventing ingress of ambient air contamination. This balancing of flows results in a net zero pressure differential across the membrane 18 and thus a constant gap 20 between the mask membrane and wafer for accurate lithography printing on the wafer substrate. Due to mechanical distortion present in the masks and wafers and local stresses due to the presence of patterns on the mask, nonparallelism cannot be removed totally.

As a result of such steps, a method of compensating for changes in mask membrane-to-semiconductor wafer spacing in a lithography apparatus caused by deflection of the mask membrane incident to differential pressure of gases exposed to first and second opposed surface of the mask membrane is provided. The method comprises impinging an incident light beam on a mask membrane first surface and through the mask membrane to a semiconductor wafer surface, detecting reflected return beams from the membrane first surface and said wafer surface, including interference fringe patterns resultant from nonparallelism of said first mask membrane surface and said wafer surface, erecting a stationary reference line indicative of the location of one of the interference fringe patterns at a null undeflected position of said mask membrane, increasing the pressure of a first gas exposed to one of the opposed mask membrane surfaces to move said one of the interference fringe patterns to a position offset from the stationary reference line and increasing the pressure of a second gas exposed to the second of the opposed mask membrane surfaces to reorient the reference interference fringe pattern back to a location on said stationary reference line to indicate a null undeflected position of the mask membrane.

It is envisioned that the movement of the fringe patterns may be visually observed by an operator who can adjust valves 29 and 32 alternately to control the pressure differential across the mask membrane 18 or appropriate sensors such as a sensor array may be utilized with a microprocessor such as a Model 8086 microprocessor from Intel Corporation to automatically balance the pressures by appropriate control over valves 29 and 32, respectively. Other 8-bit or greater microprocessors may be employed. The present method and apparatus may be used with other alignment optical systems, other than that illustrated, or as seen in the related patent application and patents cited above. The method may be used as a stand-alone technique where a separate laser beam is directed at the mask and a photodetector utilized to measure return signals.

The optical imaging system 57 shown schematically in FIG. 4 may be that seen in the Model MX-15 system of Micronix Company or may comprise a system of lenses and mirrors subcomponents which transfer the fringe patterns to a camera or monitor. A suitable camera is Model 4TN 2505 A manufactured by the General Electric Co. and a suitable video monitor is one manufactured by Sanyo such as Model DM2012. Each of the fringe pattern bands illustrated in FIGS. 4, 6 and 7 are normally approximately 25 microns in width and extend diagonally in parallelism across the monitor screen 59. The interference fringe bands are normally spaced approximately 50 microns apart.

In the second embodiment, as shown in FIG. 8, a He-Ne laser L forms a collimated beam which strikes the mask M and wafer W after reflecting from a mirror M'. Some of the light is specularly reflected from the mask and wafer surfaces and is lost ray O. In FIG. 9, the areas illuminated by the incident beam I contain targets in the form of diffraction gratings G, G' on the mask and on the wafer, respectively. As is well-known, a periodic diffraction grating forms multiple orders of diffracted beams, shown here as $-1$ m, 0 m, and $+1$ m from the mask: $-1$ w 0 w, and $+1$ w from the wafer. The beams of interest for this embodiment are the $+1$ m and $+1$ w beams which interfere with each other to modulate the intensity as detected by a photodetector D, in this case a photomultiplier tube. The modulation depends on the vertical mask to wafer spacing S and goes through cyclical variations as the spacing is changed. One complete cycle occurs for each total path length change of one wavelength ($\lambda$). Since, in this case, all beams are near vertical incidence, one cycle occurs approximately for each $\frac{1}{2}$ $\lambda$ of change in S.

If the photodetector is a single channel device without spacial resolution, then the polarity ($+$ or $-$) of the change in the spacing S is not easily detected. In this embodiment, the process gases are sequentially shut off briefly to allow the mask to return to its undeflected state while the signal is monitored. As soon as the signal becomes stable, representing the mask membrane reaching equilibrium, the change in spacing S is computed. Since the process gases each deflect the mask in a known direction, the change of spacing as the purge gases are suddenly turned on or off has a known polarity. The detection algorithm can be simple or sophisticated depending on the accuracy required. For an accuracy of about $\pm\frac{1}{2}$ $\lambda$, a simple threshold counter may be used to count the number of times the signal passes through the threshold value during the measurement cycle.

Other embodiments are possible. If the mechanical constraints are such to allow placing a detector to capture the reflected beams Ow and Om in FIG. 9, then diffraction targets are not required to generate the spacing change signals.

Alternatively if the return signals are sufficiently strong due to a fairly transparent mask substrate and reflective wafer, a signal will be detected even though there is only a mask diffraction grating type target and no wafer grating at all. This is due to the combination of various beams which are diffracted at the mask and reflected at the wafer surfaces.

The above description of the embodiments of this invention is intended to be illustrative and not limiting. Other embodiments of this invention will be obvious to those skilled in the art in view of the above disclosure.

We claim:

1. Means for detecting a change in mask-to-wafer spacing comprising:
   a semitransparent mask membrane;
   a semiconductor wafer spaced therefrom in nominal parallelism with said mask membrane;
   light source means for generating a beam of monochromatic light;
   means for transmitting said beam through the mask membrane to the semiconductor wafer spaced from said mask;
   means for reflecting said beam from a surface of said mask membrane for reflections said beam and from a surface of said wafer such that the resultant reflected beams are in interferometric relationship; and
   means for detecting a change in the interferometric relationship with respect to a change in the mask membrane-to-wafer spacing.

2. The invention set forth in claim 1 wherein said light source means is a He-Ne laser.

3. The invention set forth in claim 1 wherein said means for detecting a change comprises means for detecting a light intensity variation.

4. The invention set forth in claim 1 further including a diffraction grating target on at least one of said mask membrane or said wafer for forming multiple orders of diffracted beams which interfere with each other to modulate light intensity indicative of a change in said mask membrane-to-wafer spacing.

5. The invention set forth in claim 1 in which said means for detecting a change comprises means for detecting an interference band fringe pattern.

6. An x-ray lithographic apparatus comprising:
   an x-ray source;
   a chamber having an x-ray transmitting gaseous media therein;
   an x-ray mask membrane mounted with respect to said chamber to receive x-rays from said source and to essentially seal an opening in said chamber;
   a semiconductor wafer spacially positioned with respect to said mask membrane to receive x-rays from said source after passage of such x-rays through said chamber and mask membrane;
   first means for indicating mask membrane deflection from a gaseous media acting on one surface of said mask membrane and from a processing gas acting on a second surface of said mask membrane; and
   second means for adjusting the pressure of said gaseous media and said processing gas to null deflection of said mask membrane.

7. The invention set forth in claim 6 in which said first means comprises:
   an optical illumination source;
   means for passing an incident light beam from said illumination source through semitransparent areas of said mask membrane to a wafer surface of said wafer facing said mask membrane such that incident light striking said mask membrane and said surface is variously reflected back as return beams for interference fringe patterns from said mask membrane and said wafer surface;
   means for forming a reference indicating a first position of at least one of said fringe patterns at an initial mask membrane position;
   means for detecting movement of said at least one of interference fringe patterns resultant from deflection of said mask membrane with respect to said wafer surface caused by differential pressure of said gaseous media and said processing gas; and
   wherein said second means includes means for reorienting said at least one of said interference fringe patterns from a position resultant from said movement of said at least one of said interference fringe patterns back to a position oriented on said stationary reference line.

8. The invention set forth in claim 7 in which said incident light beam is a coherent optical laser beam.

9. The invention as set forth in claim 7 in which said means for passing an incident light beam includes a light beamsplitter, a light reflecting mirror and an objective lens directing said light beam near perpendicular to said mask membrane and said wafer surface.

10. The invention as set forth in claim 7 further including optical imaging means for detecting said return beams or said interference fringe patterns.

11. The invention as set forth in claim 10 further including a monitor screen for displaying said reference line and said interference fringe patterns from said optical imaging means.

12. The invention as set forth in claim 7 further comprising means for moving a second interference fringe pattern immediately adjacent said at least one of said fringe patterns into a moved position with respect to said stationary reference line; means for stopping an increase in pressure of said gaseous media when said second interference fringe pattern reaches said moved position; and means for increasing the pressure of said processing gas for returning said at least one of said fringe patterns to the said first position on said stationary reference line, such that there is a zero pressure differential across said mask membrane at said first position.

13. The invention as set forth in claim 12 further comprising means for alternatively increasing the flow of gaseous media and processing gas such that said second interference pattern moves to said moved position on said stationary reference line and said at least one of said fringe patterns returns to said first position with respect to said stationary reference line to maintain zero mask membrane deflection.

14. The invention as set forth in claim 7 including a laser for directing a laser beam through said mask membrane and against a surface of said wafer facing said mask membrane for forming reflected beams from said mask membrane and said wafer surface: and photodetection means for measuring the position of said reflected beams and indicating the deflection of said mask membrane by differential pressure of said gaseous media and said processing gas acting on said one surface and said second surface of said mask membrane.

15. An x-ray mask membrane deflection compensator for providing an indication of a constant even gap between a planar mask membrane, juxtaposed to an x-ray chamber having a source of gaseous media therein, and a semiconductor wafer to be imaged by the mask membrane wherein said planar mask membrane is exposed on one surface to said source of x-ray chamber gaseous media and on an opposed second surface to a source of semiconductor wafer processing gas; and wherein said semiconductor wafer is spaced from said mask membrane and generally parallel thereto, said wafer processing gas being generally confined in a space between said mask membrane and said semiconductor wafer; said compensator comprising:

a coherent optical illumination source;

means for passing incident light from said source through a portion of said mask membrane to a surface of said semiconductor wafer facing said mask membrane;

means for detecting beams including interference fringes from said incident light, reflecting from said mask membrane and reflecting from said semiconductor wafer surface;

means for forming an image of said interference fringes; and means operable in response to deflection of said mask membrane and a resultant movement of said image of said interference fringes, caused by differential pressure of said gaseous media and said pressuring gas on said one surface and second surface of said mask membrane, respectively, for adjusting the position of said interference fringes on said image, by control of the pressure of said gaseous media and said processing gas to null said mask membrane to an undeflected position representing a zero differential pressure across the mask.

16. The invention set forth in claim 15 in which said source is a laser beam.

17. The invention set forth in claim 15 in which said means for passing incident light includes a beam splitter reflecting light from said source to said mask membrane and passing said reflected beams and interference fringes from said mask membrane and wafer surface to said image-forming means.

18. The invention set forth in claim 15 further comprising means for forming a reference line on said image-forming means at a position of one said interference fringes indicative of a null undeflected mask membrane position.

19. A method of compensating for changes in mask membrane-to-semiconductor wafer spacing in a lithography apparatus caused by deflection of the mask membrane incident to differential pressure of gases exposed to first and second opposed surface of said mask membrane comprising:

impinging an incident light beam on a mask membrane first surface and through the mask membrane to a semiconductor wafer surface;

detecting reflected return beams from said membrane first surface and said wafer surface including interference fringe patterns resultant from nonparallelism of said first mask membrane surface and said wafer surface;

providing a stationary reference line indicative of the location of one of said interference fringe patterns at a null undeflected position of said mask membrane;

increasing the pressure of a first gas exposed to one of said opposed mask membrane surfaces to move said one of said interference fringe patterns to a position offset from said stationary reference line; and increasing the pressure of a second gas exposed to the second of said opposed mask membrane surfaces to reorient said one of said interference fringe patterns back to a location on said stationary reference line to indicate a null undeflected position of said mask membrane.

* * * * *